Figure 1:
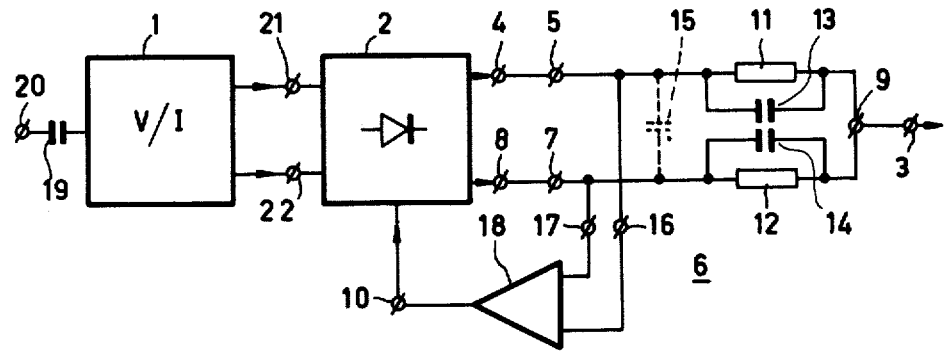

United States Patent [19]

Van de Grift

[11] 4,314,326
[45] Feb. 2, 1982

[54] RECTIFYING CIRCUIT WITH ZERO CORRECTION

[75] Inventor: Robert E. J. Van de Grift, Eindhoven, Netherlands

[73] Assignee: U.S. Philips Corporation, New York, N.Y.

[21] Appl. No.: 135,968

[22] Filed: Mar. 31, 1980

[30] Foreign Application Priority Data

Apr. 2, 1979 [NL] Netherlands ............... 7902545

[51] Int. Cl.³ .......................................... H02M 7/217
[52] U.S. Cl. ............................................... 363/127
[58] Field of Search ............... 323/4, 9, 315; 363/125, 363/127

[56] References Cited

U.S. PATENT DOCUMENTS 4,053,796 10/1977 Van de Plassche ............ 363/127 X
4,158,882 6/1979 Citta .................................... 363/127
4,187,537 2/1980 Avicola et al. ..................... 363/127

Primary Examiner—William M. Shoop
Attorney, Agent, or Firm—William J. Streeter; Bernard Franzblau

[57] ABSTRACT

The invention provides a substantial improvement of a known rectifying circuit for a.c. signals by adding a circuit which measures the d.c. unbalance at the output and subsequently cancels said unbalance by feeding back compensation currents to the rectifying circuit. A dynamic range of 1 to 10,000 or more is then attainable. The rectifying circuit supplies a current whose shape is similar to that of the a.c. input signal, thus enabling r.m.s. values to be measured, for example in voltmeters.

14 Claims, 3 Drawing Figures

RECTIFYING CIRCUIT WITH ZERO CORRECTION

The invention relates to a rectifying circuit having a first and a second circuit input, to which alternating currents are applied in push-pull, which circuit is provided with a first and a second current circuit included between the first and the second circuit input respectively and a power supply terminal. A current mirror circuit intercouples the current circuits for coupling the current in the one current circuit to the other current circuit with a current gain of substantially unity depending on the polarity of the difference of the current in the current circuits. The first or the second circuit input is coupled to a circuit output via a third and a fourth current circuit respectively, at which output the rectified alternating current is available. The third and fourth current circuits each comprise the main current paths of a transistor, having current output electrodes coupled to the circuit output.

Such a rectifying circuit is known from U.S. Pat. No. 4,053,796.

If said rectifying circuit is to have a large dynamic range, the zero error, i.e. the output signal with a short-circuited input, should not be greater than $10^{-4}$ or $10^{-5}$ of the full-scale value. It has been found that this requirement cannot be met without an automatic zero-error correction.

By utilizing the fact that in the relevant rectifying circuit the positive portion as well as the negative portion of the a.c. signal pass through separate paths, it is possible to compare the two values with each other in a comparison circuit and to measure a d.c. difference signal, which may be employed to minimize its value in a negative-feedback loop.

The invention proposes such a comparison circuit and is characterized in that for reducing a d.c. unbalance between the currents from the third and the fourth current circuits to substantially zero, a current comparison device is provided having a first input connected to the current output electrode of the third current circuit and a second input connected to the current output electrode of the fourth current circuit. A first output of the comparison device is connected to the circuit output. The comparison device also is provided with at least one control output which is connected to one of the said current circuits. The current comparison device further comprises two current transfer circuits coupled between the first and the second input respectively and the first output, integrating means coupled to the two current transfer circuits, and a differential amplifier having two input terminals coupled to the integrating means. The output of said amplifier is connected to the control output for supplying a compensation current as a function of the d.c. unbalance between the mean values of the said currents.

The aforementioned requirement in respect of accuracy is readily attainable with this circuit arrangement. Moreover, the step in accordance with the invention involves only a slight extension of the original circuit arrangement, which can readily be incorporated in an integrated circuit embodiment of the rectifying circuit. It is also advantageous that the shape of the positive and negative portions of the a.c. signal is not affected so that it always remains possible to measure an r.m.s. value. A first embodiment of the rectifying circuit in accordance with the invention is characterized in that the two current transfer circuits are identical and carry equal currents and integrating means comprises a capacitor coupled between the first and the second input, across which the input of the differential amplifier is connected. An advantage of this embodiment is that the symmetry of the original circuit arrangement is maintained and that only one capacitor is required.

A second embodiment is characterized in that the current transfer circuits are resistors. This yields a simple circuit arrangement.

A third embodiment is characterized in that the current transfer circuit constitutes a current mirror comprising two transisotrs, whose emitters are connected to a each other and to the first output, whose bases are connected to each other and to a powder supply terminal and whose one collector is conected to the first input and whose other collector is connected to the second input. An advantage of this embodiment is that a current transfer circuit is obtained which is contrast to a resistor, yields a substantially constant voltage drop over a very wide current range so that the value of the capacitor can be substantially smaller when the lower frequency range remains the same and the sensitivity is increased.

In a fourth and in a fifth embodiment the symmetrical character is also retained by the use of a push-pull arrangement for the differential amplifier and by symmetrically coupling the differential output of the amplifier to the current circuit of the original rectifier arrangement.

Figure 2:
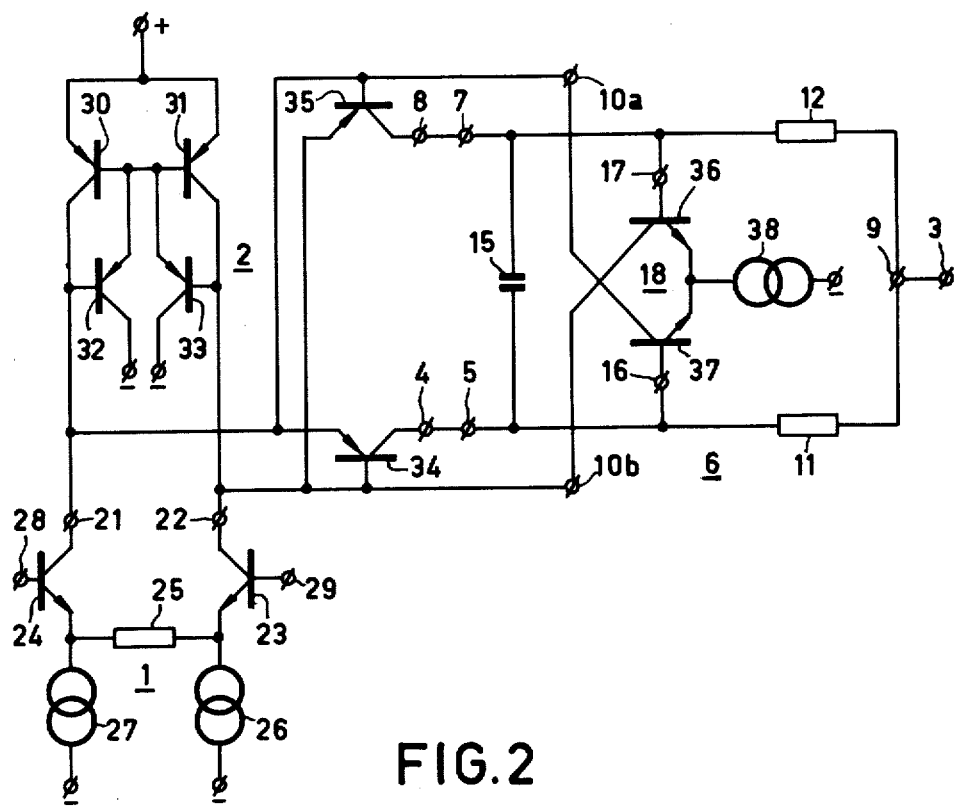

The invention will be described in more detail with reference to the accompanying drawing, in which:

FIG. 1 represents a block diagram of the invention,

FIG. 2 a simplified circuit diagram, and

Figure 3:
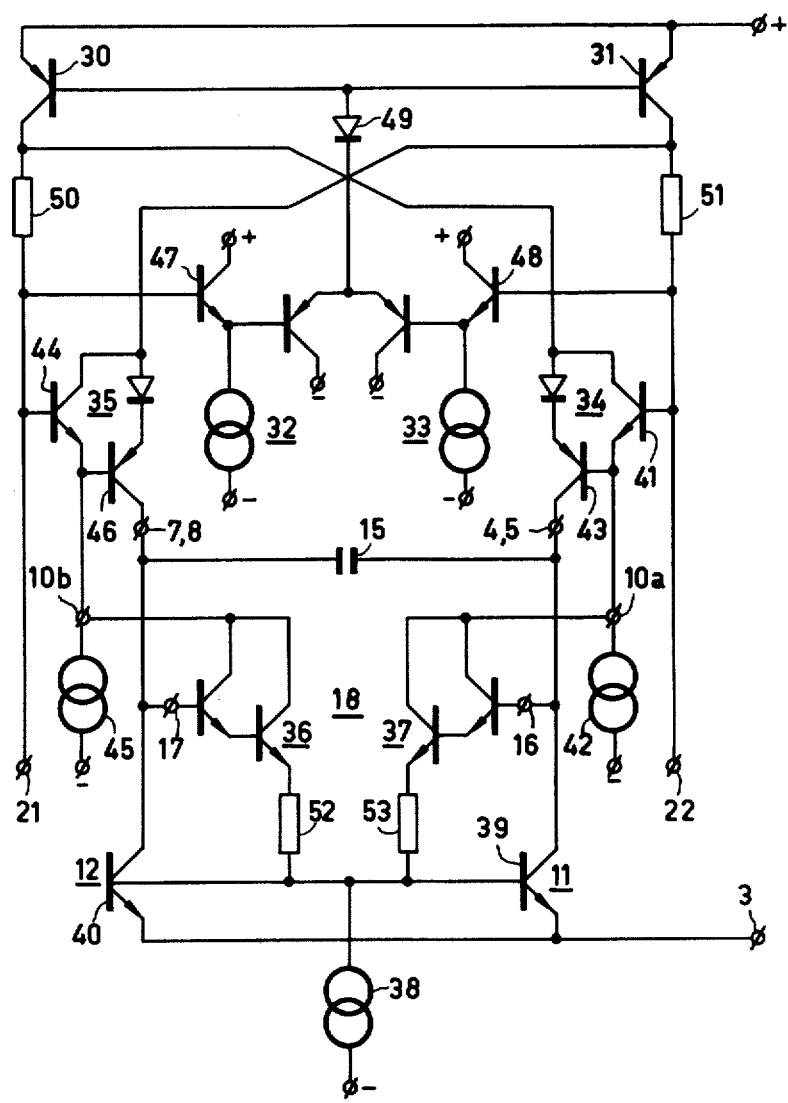

FIG. 3 a more detailed circuit diagram of a rectifying circuit in accordance with the invention.

In FIG. 1 the block 1 represents a voltage-current converter and the block 2 a rectifying circuit as described in the said U.S. patent. The rectified alternating current is available at the output terminal 3, which constitutes the circuit output. In the known circuit arrangement this terminal is connected to the collectors of two transistors which constitute the third and the fourth current circuits. In FIG. 1 of this Application these collector connections are represented by the output 4, which with a first input 5 is connected to the current comparison device 6 and by the output 8 of the fourth current circuit in block 2, which is connected to the second input 7. A first output 9 of the device 6 is connected to the circuit output 3. A control output 10 is coupled to the current circuits in block 2 for supplying a compensation current so that virtually no direct voltage can appear between the outputs 4 and 8. The current comparison device 6 further comprises two current transfer circuits 11 and 12, which are represented as resistors. Capacitors 13 and 14, which may be replaced by capacitor 15, are included as integrating elements. The difference in direct voltage across the capacitors 13 and 14, which will be equal to the direct voltage across capacitor 15 if included, is applied to the terminals 16 and 17 of the differential amplifier 18, whose output is interconnected to the control output 10. This amplifier, which may be in push-pull or not, supplies a compensation current to the rectifying circuit 2 so that either the output 4 or the output 8, or if in push-pull both outputs, supply an additional direct current which compensates for the d.c. unbalance of the currents supplied by the outputs 4 and 8 respectively, as a result of the action of the blocks 1 and 2 and of a d.c. component in the applied a.c. signal. In view of the control range of the circuit 6 the lastmentioned component is preferably eliminated by including a blocking capacitor 19 between the voltage-current converter 1 and the input 20 of the circuit.

FIG. 2 shows the blocks of FIG. 1 in more detail. The voltage-current converter 1 comprises the transistors 23 and 24. The emitters of said transistors are each connected to a current source of equal value 26 and 27 respectively and are interconnected via a resistor 25. The alternating voltage is applied to the terminals 28 and 29 so that the circuit inputs 21 and 22 of the rectifying circuit 2 receive alternating currents in push-pull. The first current circuit is constituted by the transistor 30 and the second current circuit by transistor 31. The transistors 30, 31, 32 and 33 constitute the said current mirror circuit. A transistor 34 constitutes the third current circuit and a transistor 35 the fourth current circuit.

As is known, in the case of a symmetrical biasing of the rectifying circuit 2, for example the inputs 28 and 29 being interconnected, the current I from source 27 will flow through transistor 30 and the same current I from source 26 through transistor 31. The collector voltages of these transistors are equal so that the transistors 34 and 35 are cut off and output 3 carries no current. If owing to a voltage difference at inputs 28 and 29 the current through transistor 30 is I+i, transistor 31 will carry an equal current owing to the presence of the current mirror circuit. However, the current drawn by transistor 23 is I-i so that a surplus of 2i exists. As a result of this the collector-emitter voltage of transistor 31 decreases, transistor 33 is turned off, the base-emitter voltage of transistor 32 increases and the collector-emitter voltage of transistor 30 increases. Consequently, transistor 35 is turned on and draws the current 2i, which is supplied to output 3. In the case of a polarity reversal at inputs 28 and 29 transistor 34 will carry a current 2i. In the known circuit arrangement the terminals 4, 8 and 3 were combined. In accordance with the invention a current comparison device 6 is included between the terminals 4 and 8 and the output 3. Said device comprises the resistors 11 and 12 of equal value, the capacitor 15 and the differential amplifier 18, which amplifier comprises the transistors 36 and 37 and the common emitter-current source 38. If the means values of the currents supplied by the transistors 34 and 35, i.e. the third and the fourth current circuits respectively, are equal, capacitor 15 will receive no direct voltage and the amplifier 18 will be biased symmetrically. This means that each transistor, both 36 and 37, will supply half the source current from source 38 to terminal 10b and half to terminal 10a respectively. These equal currents are supplied by the transistors 31 and 30 respectively and have no further effect on the current-mirror action of these transistors. However, if for example owing to an inequality of the sources 26 and 27 or owing to an asymmetry in the mean value of the positive relative to the negative portion of the applied alternating voltage, an additional current $I_o$ appears, for example at input 22 relative to input 21, this current will also be supplied by transistor 30 via transistor 31. Transistor 34 transfers said current. Across resistor 11 a voltage drop is produced, which considered over a prolonged time does not appear across resistor 12, so that capacitor 15 is charged. The capacitor voltage appears across inputs 16 and 17 of amplifier 18 so that said amplifier will carry asymmetrical currents in the transistors 36 and 37. The current in transistor 37 increases to the same extent as the current in transistor 36 decreases. A balanced state is obtained when, at a minimal voltage across capacitor 15, the transistor 37 drains a current $\frac{1}{2} I_o$, i.e. via terminal 10a from transistor 30. Transistor 31 then also supplies a current $\frac{1}{2} I_o$. Transistor 36 draws a current $-\frac{1}{2} I_o$ or supplies a current $\frac{1}{2} I_o$ to terminal 10b, which in conjunction with the current $\frac{1}{2} I_o$ from transistor 31 yields the original unbalance current $I_o$. Transistor 34 need no longer take up this current, so that the unbalance in current between outputs 4 and 8 is substantially eliminated and output 3 is substantially currentless or supplies only the pure a.c. components. Depending on the control loop gain this is determined by the gain factor of amplifier 18 and the values of the resistors 11 and 12. For a maximum value of this gain the circuit of FIG. 3 has been developed.

FIG. 3 the current transfer circuits 11 and 12 between the terminals 4, 5 and 3 and between the terminals 7, 8 and 3 respectively are constituted by a current mirror circuit comprising the transistors 39 and 40. A current from one of the current outputs 7, 8 or 4, 5 to output 3 is equally distributed over the transistors 39 and 40. This half current flows through capacitor 15. In the case of an a.c. signal to be measured capacitor 15 is alternately charged and discharged by said current, because alternately output 7, 8 or output 4, 5 supplies current. If there is an unbalance or asymmetry in these currents the capacitor will retain a residual charge. The corresponding capacitor voltage is measured by amplifier 18 comprising transistors 36 and 37, which are each connected in a Darlington arrangement to provide additional current gain. In FIG. 3 the third and the fourth current circuits, i.e. the transistors 34 and 35 of FIG. 2, are respectively constituted by an emitter-follower 41 with a current source 42 connected to the transistor 43 which transfers the output current, and by the emitter-follower 44 with the current source 45 and a transistor 46 which transfers the output current. Moreover, said emitter-followers 41 and 44 may be employed for transferring the compensation currents from amplifier 18 to the current mirror circuit 30-31 via the terminals 10a and 10b. In FIg. 3 the transistors 32 and 33 of FIG. 2 are also provided with emitter-followers 47 and 48 in order to minimize the load presented to the input circuits of the arrangement. The voltage drops of diode 49 and resistors 50 and 51 enable the current mirror circuit to be adjusted accurately. By means of the resistors and 52 and 53 of amplifier 18 the gain factor can be adjusted so that no oscillations are produced in the control circuit.

What is claimed is:

1. A rectifying circuit comprising a first and a second circuit input for receiving alternating currents applied in push-pull, first and second current circuits connected between the first and the second circuit inputs respectively and a power supply terminal and provided with a current mirror circuit which intercouples the current circuits for coupling the current in the one current circuit to the other current circuit with a current gain of substantially unity depending on the polarity of the difference of the currents in the current circuits, means coupling the first and the second circuit inputs to a circuit output via a third and a fourth current circuit respectively, to derive at said output a rectified alternating current, said third and fourth current circuits each comprising the main current paths of a transistor having current output electrodes coupled to the circuit output, and means for reducing a d.c. unbalance between the currents from the third and the fourth current circuits to substantially zero comprising, a current comparison device having a first input connected to the current output electrode of the third current circuit, a second input connected to the current output electrode of the fourth current circuit and a first output connected to the circuit output, said current comparison device including at least one control output connected to one of the said current circuits and further comprising two current transfer circuits included between the comparison device first and second inputs respectively and the first output, integrating means coupled to said current transfer circuits, and a differential amplifier having two input terminals coupled to said integrating means and an amplifier output connected to the control output for supplying a cmpensation current as a function of the d.c. unbalance between the means values of the said currents.

2. A rectifying circuit as claimed in claim 1, wherein the two current transfer circuits are identical and carry identical currents and the integrating means comprises a capacitor coupled between the comparison device first and second inputs and across which the input terminals of the differential amplifier are connected.

3. A rectifying circuit as claimed in claim 1 wherein the current transfer circuits comprise resistors.

4. A rectifying circuit as claimed in claim 2 wherein the two current transfer circuits comprise a current mirror comprising two transistors having their emitters connected to each other and to the first output, their bases connected to each other and to a power supply terminal, and having one collector connected to the first input and the other collector connected to the second input of the current comparison device.

5. A rectifying circuit as claimed in any one of the claims 1 to 4 wherein the differential amplifier is provided with a differential output comprising first and second outputs coupled to the first and to the second current circuits, respectively.

6. A rectifying circuit as claimed in claim 5 further comprising means for coupling the differential amplifier first and second outputs to the third and fourth current circuits, respectively.

7. A rectifying circuit as claimed in claim 1 wherein the two current transfer circuits comprises a current mirror circuit comprising first and second transistors having their emitters connected together and to the comparison device first output, their bases connected together and to a power supply terminal, and the collectors of the first and second transistors being connected to the first and second inputs, respectively, of the current comparison device.

8. A rectifying circuit as claimed in claim 7 wherein the differential amplifier output comprises first and second output terminals coupled to the first and second current circuits, respectively, and to the third and fourth current circuits, respectively.

9. A rectifying circuit as claimed in claims 1, 2, 4, 7 or 8 further comprising a voltage-current converter for coupling said first and second circuit inputs to a source of AC signal voltage.

10. A rectifying circuit as claimed in claims 1 or 7 wherein the differential amplifier comprises first and second transistors having their emitters connected together and to the power supply terminal via a current source, their bases coupled to the comparison device first and second inputs, respectively, and their collectors coupled to said first and second current circuits, respectively.

11. A rectifying circuit comprising first and second input terminals for receiving alternating input currents, an output terminal, a power supply terminal, first and second current circuits connected between the first and second input terminals, respectively, and the power supply terminal, a current mirror circuit coupling said first and second currrent circuits together to maintain equal currents therein, third and fourth current circuits each including a transistor, means coupling said first and second input terminals to said output terminal via said third and fourth current circuits, respectively, to derive thereat a rectified alternating output current, a current comparison device for reducing any DC imbalance between the currents supplied by the third and fourth current circuits and having first and second inputs, a first output and a control output, means coupling said first and second inputs to current output electrodes of the third and fourth current circuits, respectively, the first output to the circuit output terminal and the control output to at least one of said current circuits, said current comparison device further comprising first and second current transfer circuits connected between the first and second inputs, respectively, and the first output, integrating means coupled to said current transfer circuits, and a differential amplifier having input means coupled to said integrating means and output means coupled to the control output for supplying thereto a compensation current in a manner so as to reduce to a minimum value any said DC imbalance of the currents.

12. A rectifying circuit as claimed in claim 11 further comprising a voltage-current converter comprising a first transistor and a first current source connected in series to the first input terminal and a second transistor and a second current source connected in series to the second input terminal, and means for coupling the control electrodes of the first and second transistors to a source of AC signal voltage.

13. A rectifying circuit as claimed in claims 11 or 12 wherein said integrating means comprises a capacitor coupled across the first and second inputs of said comparison device.

14. A rectifying circuit as claimed in claims 11 or 12 wherein said first and second current transfer circuits comprise a current mirror circuit having first and second terminals coupled to the first and second inputs of the comparison device, respectively, and a common terminal coupled to the first output of the comparison device.

* * * * *